(12) United States Patent
Maciejewski et al.

(10) Patent No.: US 9,581,662 B2
(45) Date of Patent: Feb. 28, 2017

(54) CYLINDRICAL MAGNETIC RESONANCE DEVICE HAVING A CIRCULAR ARC SHAPED HOUSING SHELL WHEN MOUNTED THAT BECOMES BAR-SHAPED WHEN DEMOUNTED

(75) Inventors: Bernd Maciejewski, Markt Erlbach (DE); Annette Stein, Erlangen (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 722 days.

(21) Appl. No.: 13/603,621

(22) Filed: Sep. 5, 2012

(65) Prior Publication Data

US 2013/0234713 A1 Sep. 12, 2013

(30) Foreign Application Priority Data

Sep. 9, 2011 (DE) .................. 10 2011 082 401

(51) Int. Cl.
*G01R 33/30* (2006.01)
*G01R 33/34* (2006.01)

(52) U.S. Cl.
CPC ....... *G01R 33/30* (2013.01); *G01R 33/34007* (2013.01); *G01R 33/34046* (2013.01)

(58) Field of Classification Search
USPC ............................ 324/300–322; 600/407–435
See application file for complete search history.

(56) References Cited

U.S. PATENT DOCUMENTS

| 5,345,177 | A | * | 9/1994 | Sato et al. ................... 324/318 |
| 6,208,141 | B1 | * | 3/2001 | Amor, Sr. ............ G01R 33/385 324/307 |
| 6,414,489 | B1 | * | 7/2002 | Dean et al. ................... 324/318 |
| 6,437,568 | B1 | * | 8/2002 | Edelstein et al. ............. 324/318 |
| 7,671,593 | B2 | * | 3/2010 | Goldhaber ....... G01R 33/34046 324/307 |
| 8,779,773 | B2 | * | 7/2014 | de Lima .......... G01R 33/34007 324/318 |
| 2005/0040825 | A1 | * | 2/2005 | Sellers et al. ................. 324/318 |
| 2007/0290686 | A1 | * | 12/2007 | Goldhaber ....... G01R 33/34046 324/318 |
| 2013/0043870 | A1 | * | 2/2013 | de Lima .......... G01R 33/34007 324/318 |
| 2013/0234709 | A1 | * | 9/2013 | Hierl et al. ................... 324/318 |
| 2013/0234711 | A1 | * | 9/2013 | Dietz et al. ................... 324/319 |
| 2013/0234712 | A1 | * | 9/2013 | Dietz et al. ................... 324/319 |

(Continued)

FOREIGN PATENT DOCUMENTS

CN 19304848 A 3/2007
CN 101061390 A 10/2007

(Continued)

*Primary Examiner* — Melissa Koval
*Assistant Examiner* — Tiffany Fetzner

(57) ABSTRACT

A magnetic resonance device is proposed. The device has a magnet unit having a cylindrical radio frequency coil unit, a cylindrical accommodation area for accommodating a patient, and a housing unit surrounding the magnet unit with at least one housing shell unit. The radio frequency coil unit cylindrically surrounds the accommodation area. The housing shell unit is disposed between the accommodation area and the radio frequency coil unit. The at least one housing shell unit is constituted at least partially by a flexible spring/mass unit.

8 Claims, 4 Drawing Sheets

(56) References Cited

U.S. PATENT DOCUMENTS

2013/0234713 A1* 9/2013 Maciejewski et al. ....... 324/321
2015/0102813 A1* 4/2015 Dumoulin .............. G01R 33/34
                                                        324/322

FOREIGN PATENT DOCUMENTS

| DE | 4227388 A1 | 2/1994 |
| DE | 102004047344 A1 | 1/2006 |
| DE | 202006008449 U1 | 8/2006 |
| JP | 2005087523 A | 4/2005 |
| JP | 2006341109 A | 12/2006 |
| JP | 2008520265 A | 8/2008 |
| WO | WO 2008137003 A1 | 11/2008 |

* cited by examiner

Legend:
14: accommodation area
15: patient
16: patient couch
19: radio frequency coil unit
24: top surface of 16
25: surface of 19 facing 14
30: housing shell
31: housing shell unit
32: support layer
33: flexible foam layer
34: elastic outer layer
35: spacer
36: flexible spring/mass unit
37: layer thickness of 33
38: layer thickness of 32
39: layer thickness of 34

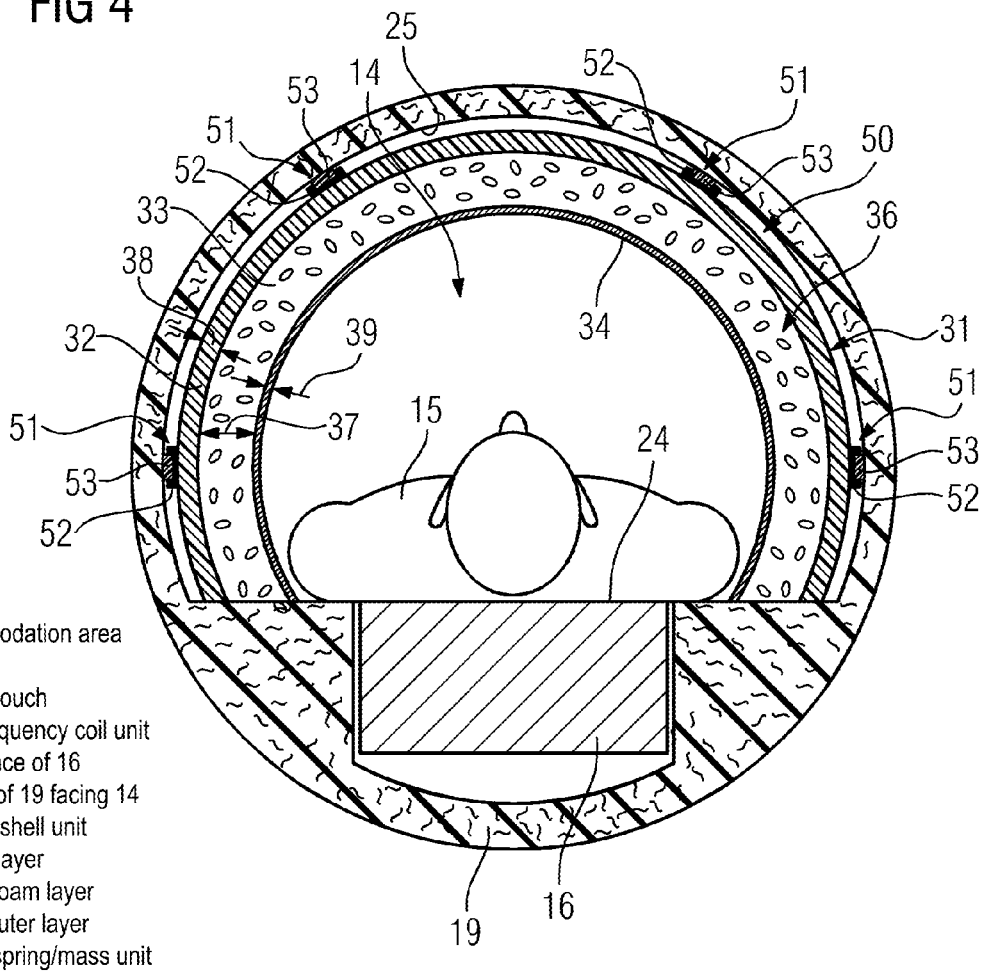

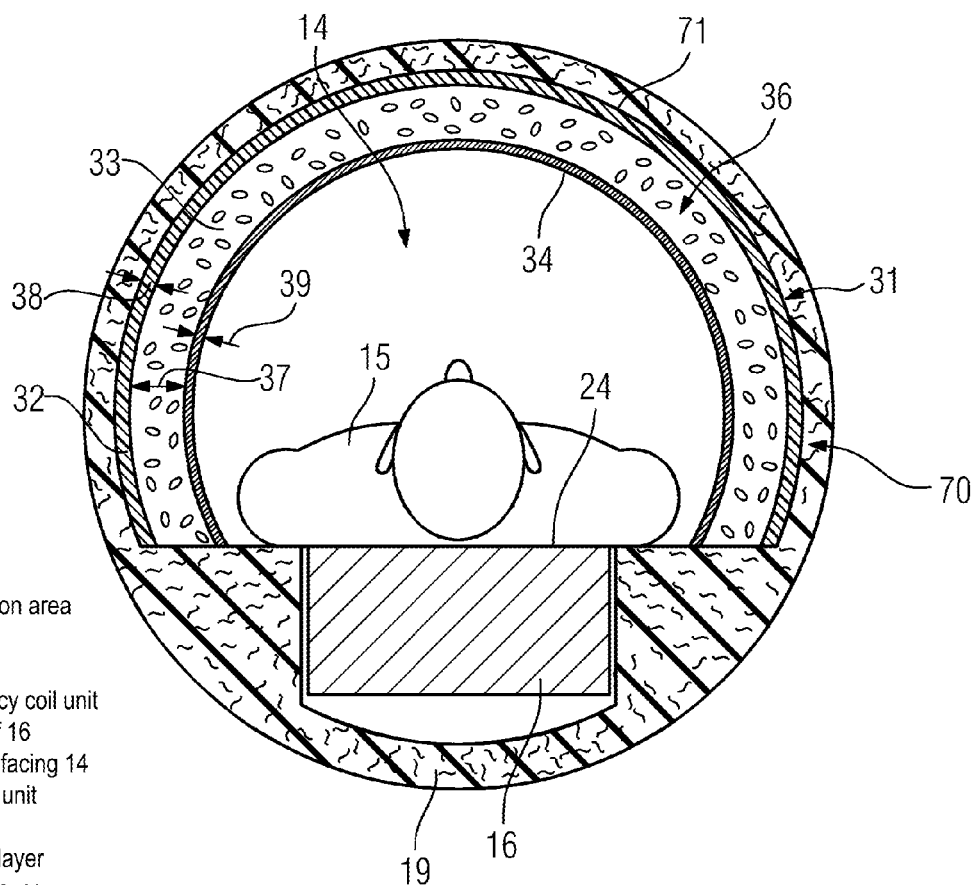

CYLINDRICAL MAGNETIC RESONANCE DEVICE HAVING A CIRCULAR ARC SHAPED HOUSING SHELL WHEN MOUNTED THAT BECOMES BAR-SHAPED WHEN DEMOUNTED

CROSS-REFERENCE TO RELATED APPLICATIONS

This application claims priority of German application No. 10 2011 082 401.4 filed Sep. 9, 2011, which is incorporated by reference herein in its entirety.

FIELD OF INVENTION

The present application relates to a magnetic resonance device having a magnet unit with a cylindrical radio frequency coil unit, a cylindrical accommodation area for accommodating a patient, wherein the radio frequency coil unit cylindrically surrounds the accommodation area, and to a housing unit surrounding the magnet unit and having at least one housing shell unit, said housing shell unit being disposed between the accommodation area and the radio frequency coil unit.

BACKGROUND OF INVENTION

During operation, magnetic resonance devices produce high-pitched operating noise which can be unpleasant for a patient located in an accommodation area of the magnetic resonance device for examination. This high-pitched operating noise is produced inside a magnet unit of the magnetic resonance device. Here sound waves are transmitted from a gradient system of the magnet unit to a main magnet of the magnet unit. From said main magnet, the noise is transmitted to a housing unit of the magnetic resonance device and emitted therefrom in a space surrounding the magnetic resonance device, such as in an accommodation area for accommodating the patient that is surrounded by a radio frequency coil unit.

Conventional housing units of magnetic resonance devices have a single housing shell unit typically made of a glass-fiber reinforced plastic and/or a thermoplastic material. Although these housing shell units provide, because of their mass, a certain amount of sound insulation, housing shell units implemented in this way also exhibit a high emission characteristic in respect of sound wave emission due to the material stiffness of the housing shell units. In addition, acoustic resonances may be produced in the patient area of the magnetic resonance device which can add to the patient's noise exposure.

SUMMARY OF INVENTION

The object of the present application is to provide a magnetic resonance device wherein effective noise protection is achieved in an accommodation area for the patient. This object is achieved by the features of the independent claims. Embodiments are described in the dependent claims.

The application is based on a magnetic resonance device having a magnet unit comprising a cylindrical radio frequency coil unit, a cylindrical accommodation area for accommodating a patient, wherein the radio frequency coil unit cylindrically surrounds the accommodation area, and a housing unit surrounding the magnet unit and having at least one housing shell unit, said housing shell unit being disposed between the accommodation area and the radio frequency coil unit.

It is proposed that the at least one housing shell unit is constituted by a flexible spring/mass unit. This provides effective noise protection inside the accommodation area for the patient in that the design of the housing shell unit produces an acoustic damping and/or acoustic decoupling effect between the magnet unit, such as the radio frequency coil unit, and the accommodation area for accommodating the patient. In this context, a spring/mass unit is to be understood as meaning a unit of the housing shell unit which has at least one elastic spring element and at least one heavy mass element, so that damping and/or decoupling of sound waves is achieved because of a high inertia and absorption of vibrational energy of sound waves. The at least one elastic spring element and the at least one heavy mass element can be implemented in one piece here. In addition, a flexible implementation of the spring/mass unit is to be understood as meaning that a resonant frequency of the spring/mass unit is placed above 3000 Hz or above 5000 Hz, so that the resonant frequency of the flexible spring/mass unit lies outside a frequency range relevant for noise transmission.

The housing shell unit has at least one support layer ensuring a high degree of stability of the housing shell unit. The flexible spring/mass unit is disposed on the support layer. The support layer can be made at least partially of a glass-fiber reinforced plastic, e.g. a laminated fabric, and/or a polycarbonate, such as, Lexan, and/or a flexible but solid thermoplastic, etc.

A compact housing shell unit can be achieved if the at least one support layer has a layer thickness of at least 0.5 mm and no more than 2.0 mm. In addition, a large accommodation area for the patient can be provided. The layer thickness can have a value of between 1 and 1.5 mm.

It is further proposed that the housing shell unit has, in the mounted state, a circular arc shaped cross-sectional area and, in the dismounted state, a bar-shaped cross-sectional area. For this purpose the housing shell unit is of elastic design in respect of the action of bending forces. The housing shell unit can be disposed on the radio frequency coil unit in a simply constructed manner, without tools being required, by tensioning the housing unit against an inner wall of the cylindrical radio frequency coil unit. In addition, the housing shell unit can be disposed removably inside the cylindrical radio frequency coil unit and/or demountably on the radio frequency coil unit. Thus, the housing shell unit can be demounted when a large amount of space is required for a magnetic resonance examination as in the situation of either claustrophobic and/or adipose patients. The housing shell unit can thus be braced with the radio frequency coil unit irrespective of the positioning of the patient; so that undesirable slippage of existing noise protection devices, such as ear defenders, can be prevented.

Acoustic decoupling and/or acoustic damping can be achieved if the spring/mass unit comprises a flexible foam unit. Said flexible foam unit acts as an acoustic spring which converts vibrational energy of acoustic oscillations and/or sound waves at least partially into another form of energy such as thermal energy, etc.

A layer thickness of the flexible foam layer is designed to provide effective acoustic damping and a maximum aperture for the cylindrical accommodation area. Said flexible foam layer has a layer thickness of approximately 10 to 20 mm.

In another embodiment of the application it is proposed that the flexible foam unit is disposed on a radially inward facing surface of the housing shell unit. Direct attachment of the housing shell unit to the radio frequency coil unit, on the basis of a tensioning force produced by a braced shape of the housing shell unit, can be achieved.

It is additionally proposed that the spring/mass unit has at least one elastic outer layer. The outer layer is constituted by a high-mass cover layer, said outer layer being able to act as an acoustic mass inside the spring/mass unit, thereby enabling a reduction in and/or damping of sound waves to be achieved. The elastic outer layer has a density per unit area of at least 3 kg/m$^2$ or of at least 5 kg/m$^2$. The elastic outer layer can be constituted by a vinyl layer and/or an artificial leather layer and/or an EPDM (ethylene propylene diene monomer) layer and/or other materials as would appear reasonable to the average person skilled in the art. The elastic outer layer can also have a design tailored to an upcoming application, such as a design specifically for children. In addition, the magnetic resonance device can comprise a plurality of housing shell units having different surfaces facing the accommodation area, so that a housing shell unit with a design appropriate for the upcoming application is available depending on requirements. The elastic outer layer is disposed inside the accommodation area on a side of the housing shell unit facing a patient couch.

A compact yet flexible, such as elastic, housing shell unit can be achieved if the elastic outer layer has a maximum layer thickness of approximately 2 mm. However, the maximum layer thickness of the elastic outer layer is approximately 1 mm.

In one development of the application it is proposed that the housing shell unit has at least one spacer which is disposed between the radio frequency coil unit and the at least one support layer, thereby enabling additional acoustic decoupling to be achieved between the radio frequency coil unit and the support layer because of a spacing between the support layer and the radio frequency coil unit. Direct coupling of structure-borne noise to the support layer can be prevented in this way. Said spacer is constituted by a vibration damping material, such as a sylomer, etc.

For an alternative arrangement of the housing shell unit on the magnetic resonance device it can be provided that the housing unit has at least one rail unit by which the housing shell unit is mounted on the magnet unit, on the radio frequency coil unit.

For another possible arrangement of the housing shell unit on the magnet unit, such as on the radio frequency coil unit, the housing unit can have a material bonding unit by which the housing shell unit is disposed on the magnet unit. The material bonding unit is constituted by a gluing unit.

The housing unit is of magnetic resonance compatible design. Here magnetic resonance compatible design is to be understood as meaning that the housing unit behaves neutrally and/or passively in radio frequency terms and does not contribute to magnetic resonance imaging.

BRIEF DESCRIPTION OF THE DRAWINGS

Features and details of the application will emerge from the embodiment described below with reference to the accompanying drawings in which:

FIG. 4 shows a second example of the housing shell unit which is disposed on the radio frequency coil unit by a rail unit, and FIG. 5 shows a third example of the housing shell unit which is disposed on the radio frequency coil unit by a material bonding unit.

DETAILED DESCRIPTION OF INVENTION

Figure 1:
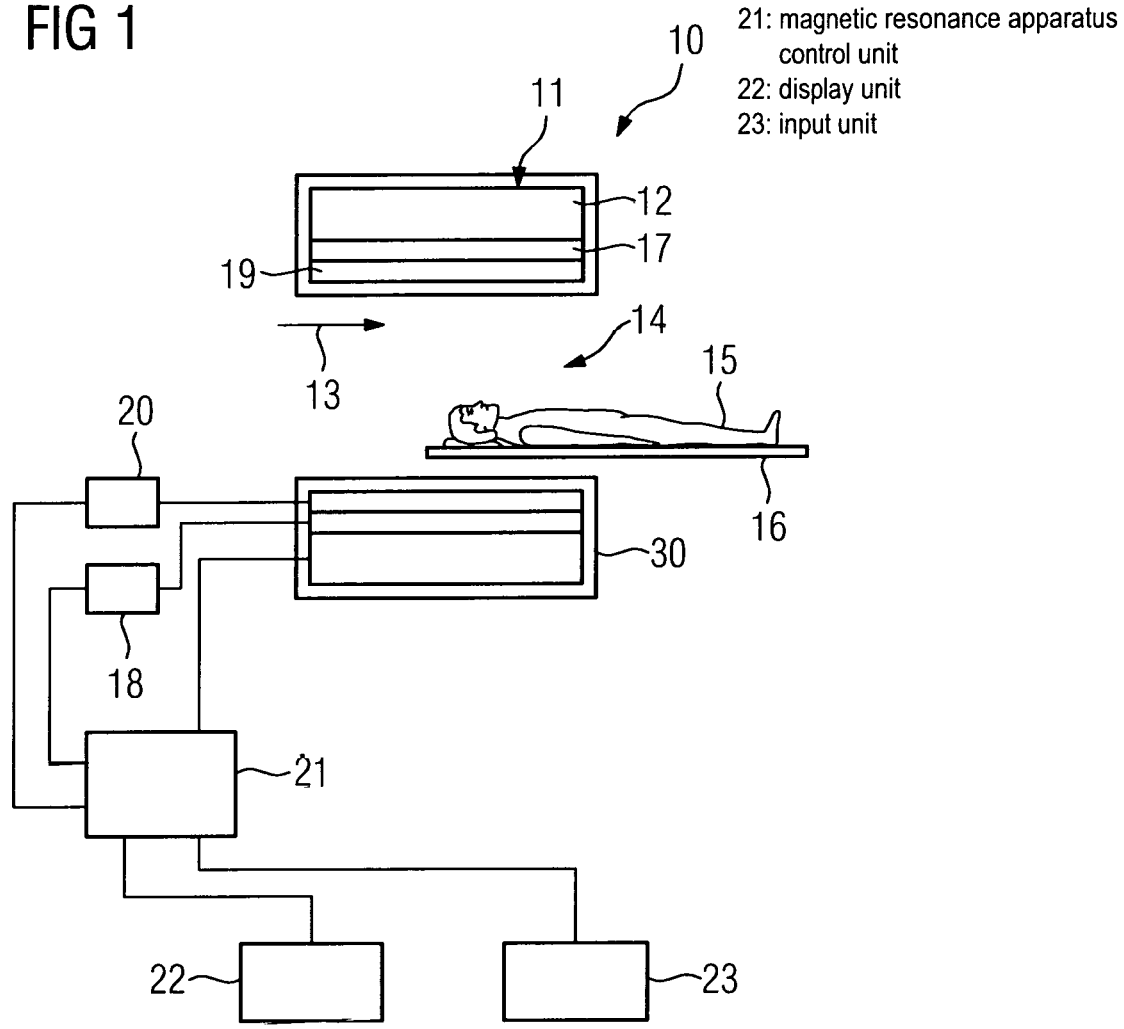
FIG. 1 shows a schematic diagram of a magnetic resonance device according to the application.

FIG. 1 schematically illustrates a magnetic resonance device according to the application. The magnetic resonance device 10 comprises a magnet unit 11 having a main magnet 12 for generating a powerful and constant main magnetic field 13. The magnetic resonance device 10 additionally has a cylindrical accommodation area 14 for accommodating a patient 15, said accommodation area 14 being enclosed in a circumferential direction by the magnet unit 11. The patient 15 can be slid into the accommodation area 14 on a patient couch 16 of the magnetic resonance device 10, for which purpose the patient couch 16 is displaceably disposed inside the magnetic resonance device 10. In addition, the magnetic resonance device 10 has a housing unit 30 surrounding the magnet unit 11.

The magnet unit 11 additionally has a gradient coil 17 for generating magnetic field gradients and which is used for position encoding during imaging. The gradient coil 17 is controlled by a gradient control unit 18. The magnet unit 11 additionally has a cylindrical radio frequency coil unit 19 and a radio frequency control unit 20 for exciting a polarization which appears in the main magnetic field 13 produced by the main magnet 12. The radio frequency coil unit 19 is controlled by the radio frequency control unit 20 and irradiates an examination space, which is constituted by the accommodation area 14, with radio frequency magnetic resonance sequences, thereby causing the magnetization to be displaced from its equilibrium state. In addition, magnetic resonance signals are received by the radio frequency coil unit 10.

For controlling the main magnet 12, the gradient control unit 18 and for controlling the radio frequency control unit 20, the magnetic resonance device 10 has a control unit 21 constituted by a processor unit. The processor unit centrally controls the magnetic resonance device 10, e.g. the execution of a predetermined imaging gradient echo sequence. Control information such as imaging parameters and reconstructed magnetic resonance images can be displayed on a display unit 22, e.g. on at least one monitor, of the magnetic resonance device 10 for an operator. The magnetic resonance device 10 additionally has an input unit 23 by which information and/or parameters can be entered by an operator during a measuring process.

The magnetic resonance device 10 may comprise more components normally found in magnetic resonance devices 10. As the general mode of operation of a magnetic resonance device 10 will also be familiar to the person skilled in the art, a detailed description of the general components will be dispensed with.

Figure 2:
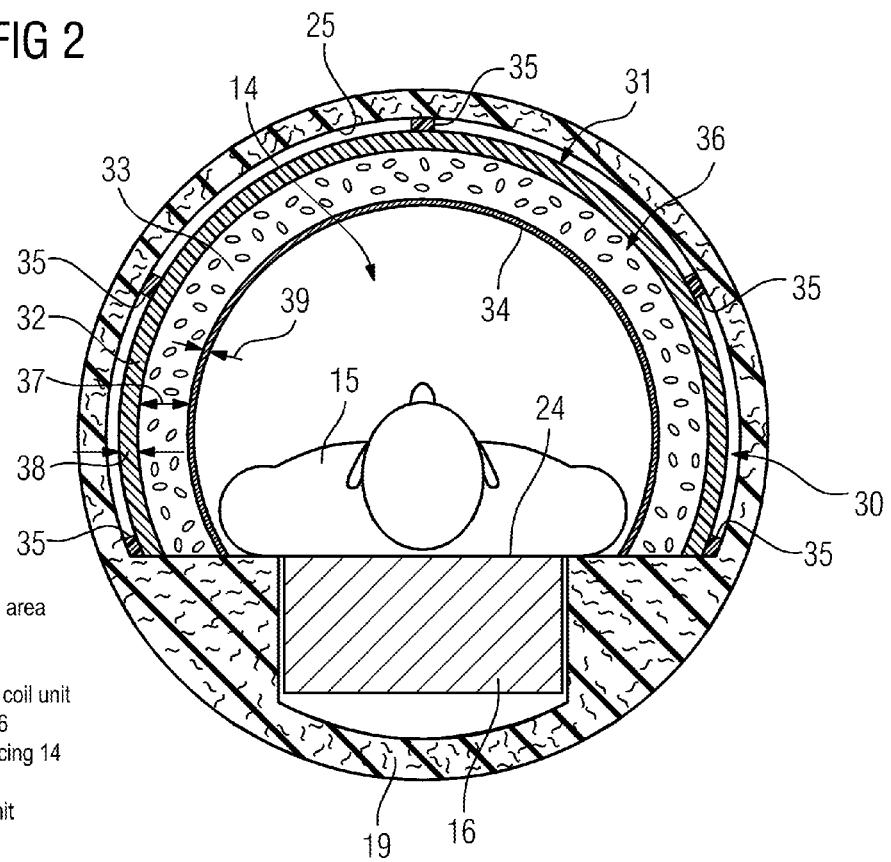
FIG. 2 shows a first example of a housing shell unit which is braced with a radio frequency coil unit.

FIG. 2 shows a section of the housing unit 30 in more detail. The housing unit 30 is of magnetic resonance compatible design and comprises a housing shell unit 31 which is disposed between the accommodation area 14 and the cylindrical radio frequency coil unit 19. The housing shell unit 31 has a cross-sectional area which is circular arc shaped and is disposed on a cylinder segment shaped accommodation area 14 delimited by and facing a top surface 24 of the patient couch 16 which divides the cylindrical accommodation area 14 into two cylinder segments, on the inward facing surface or more specifically the surface 25 of the radio frequency coil unit 19 facing the accommodation area 14.

In the present example, the housing shell unit 31 is of triple-layer construction and comprises a support layer 32, a flexible foam layer 33 and an elastic outer layer 34. The support layer 32 has a minimum layer thickness 38 of 0.5 mm and a maximum layer thickness 38 of 2.0 mm. However, the support layer 32 has a layer thickness 38 having a value between 1.0 and 1.5 mm. The support layer 32 provides the housing shell unit 31 with rigidity for disposing it on the radio frequency coil unit 19. For this purpose, the support layer 32 is made of a glass fiber reinforced plastic such as a laminated fabric, and/or of a polycarbonate, such as Lexan, and/or of a flexible but solid thermoplastic, etc.

Figure 3:
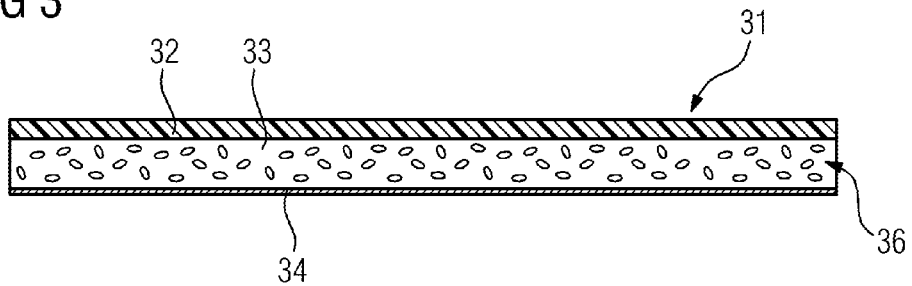
FIG. 3 shows the housing shell unit from FIG. 2 in a demounted state.

In the mounted state, the cross-sectional area of the housing shell unit 31 is circular arc shaped and, in the demounted state, has a bar-shaped cross-sectional area (see FIGS. 2 and 3). In this way the housing shell unit can be braced with the radio frequency coil unit 19, with the surface 25 of the radio frequency coil unit 19 facing the accommodation area 14 and also secured against undesirable slippage and/or from falling out of the accommodation area 14.

In addition, the housing shell unit 31 has spacers 35 which are disposed on the support layer 32 (FIG. 2). Said spacers 35 are disposed on the side of the support layer 32 facing the radio frequency coil unit 19 so that the support layer 32 is additionally disposed at a distance from the radio frequency coil unit 19. The spacers 35 are constituted by a vibration damping material so that direct sound wave transmission, transmission of structure-borne sound waves, from the radio frequency coil unit 19 via the spacers 35 to the support layer 32 is suppressed and/or reduced.

Alternatively it is also possible to dispense with the spacers 35 so that, in a mounted state of the housing shell unit 31 with the radio frequency coil unit 19, the support layer 32 rests directly against the radio frequency coil unit 19.

The housing shell unit 31 comprises a flexible spring/mass unit 36, wherein the flexible spring/mass unit 36 incorporates the flexible foam unit 33 and the elastic outer layer 34. Said flexible foam unit 33 acts as an acoustic spring and the elastic outer layer 34 as an acoustic mass inside the spring/mass unit 36. The flexible foam unit has a layer thickness 37 of approximately 10 to 20 mm, the flexible foam layer 33 being disposed on the support layer 32 on a surface of the support layer 32 facing away from the radio frequency coil unit 19, i.e. a radially inward facing surface of the support layer 32.

The elastic outer layer 34 is disposed on a side of the housing shell unit 31 surrounding the accommodation area 14 facing a patient area or more specifically the top surface 24 of the patient couch 16. The elastic outer layer 34 additionally has a maximum layer thickness 39 of 2 mm, but a layer thickness 39 of 1 to 2 mm. Said outer layer 34 can be constituted by an artificial leather layer and/or a vinyl layer and/or an EPDM layer, etc. In addition, the elastic outer layer 34 can have an application-specific design and/or pattern on a surface facing the accommodation area 14, such as a special design and/or pattern for a magnetic resonance examination of a child.

Because the at least partially flexible housing shell unit 31 is braced against the radio frequency coil unit 19, the housing shell unit 31 can be demounted from the accommodation area 14 or removed from the radio frequency coil unit 19 in a constructionally simple manner during maintenance work or in the case of claustrophobic and/or adipose patients.

Disposing such a housing shell unit 31 inside the accommodation area 14 produces a noise reduction of some 12 dB inside the accommodation area 14 during operation of the magnetic resonance device 10.

FIGS. 4 and 5 show alternative examples of the housing unit 50, 70. Components, features and functions that remain the same are basically numbered with the same reference characters. The following description is confined to the differences with respect to the example shown in FIGS. 1 to 3, reference being made to the description of the example in FIGS. 1 to 3 in respect of components, features and functions that remain the same.

FIG. 4 shows an alternative housing unit 50 to that in FIG. 2. The housing unit 50 has a housing shell unit 31 which is implemented similarly to the housing shell unit 31 in the description for FIG. 2. For disposing the housing shell unit 31 on the magnet unit 11, such as on the radio frequency coil unit 19 of the magnet unit 11, the housing unit 50 has a rail unit 51. The rail unit 51 has one or more first rail elements 52 which are disposed on a side of the housing shell unit 31 facing the radio frequency coil unit 19. The rail unit 51 additionally has one or more second rail elements 53 which are disposed on the side of the radio frequency coil unit 19 facing the accommodation area 14 of the magnetic resonance device 10. The rail elements 52, 53 are disposed along a cylindrical extension of the radio frequency coil unit 19 on the radio frequency unit 19 and a support layer 32 of the housing shell unit 31. In addition, the second rail elements 53 corresponding to the first rail elements 52 are implemented such that they engage one another in a form fit manner to attach the housing shell unit 31 to the radio frequency coil unit 19.

This enables the housing shell unit 31 to be detachably mounted on the magnet unit 11, wherein the housing shell unit 31 can be moved or more precisely slid out of the accommodation area 14 along the rail elements 52, 53.

FIG. 5 shows an alternative housing unit 70 to that in FIG. 2. The housing unit 70 has a housing shell unit 31 which is implemented similarly to the housing shell unit 31 as described with reference to FIG. 2. For attaching the housing shell unit 31 to the radio frequency coil unit 19 of the magnet unit 11, the housing unit 70 has a material bonding unit 71 which is constituted by a gluing unit. The housing shell unit 31 is glued to the radio frequency coil unit 19 of the magnet unit 11 by the material bonding unit.

Alternatively, the housing shell unit 31 can also be provided without a support layer 32 and glued directly to the radio frequency coil unit 19.

The invention claimed is:
1. A magnetic resonance device, comprising:
a magnet unit comprising:
  a cylindrical radio frequency coil unit,
  a cylindrical accommodation area configured for accommodating a patient, and
  a housing unit surrounding the magnet unit comprising at least one housing shell unit,
  wherein the radio frequency coil unit cylindrically surrounds the accommodation area,
  wherein the housing shell unit is disposed between the accommodation area and the radio frequency coil unit, and
  wherein the at least one housing shell unit is constituted at least partially by a flexible spring/mass unit, wherein the housing shell unit is of a triple-layer construction comprising:
   a rigid support layer disposed on the radio frequency coil unit,
   a flexible foam layer disposed on a surface of the rigid support layer facing away from the radio frequency coil unit, and
   an elastic outer layer disposed on a side of the housing shell unit surrounding the accommodation area,
   wherein the housing shell unit has a circular arc shaped cross-sectional area in a mounted state when it is disposed between the accommodation area and the radio frequency coil unit, and
   wherein the same housing shell unit also has a bar shaped cross-sectional area in a demounted state when it is removed from between the accommodation area and the radio frequency coil unit.

2. The magnetic resonance device as claimed in claim 1, wherein the support layer comprises a layer thickness of at least 0.5 mm and no more than 2.0 mm.

3. The magnetic resonance device as claimed in claim 1, wherein the flexible foam unit comprises a layer thickness of approximately 10 to 20 mm.

4. The magnetic resonance device as claimed in claim 1, wherein the elastic outer layer comprises a maximum layer thickness of approximately 2 mm.

5. The magnetic resonance device as claimed in claim 1, wherein the housing shell unit comprises at least one spacer disposed between the radio frequency coil unit and the support unit.

6. The magnetic resonance device as claimed in claim 1, wherein the housing unit comprises at least one rail unit by which the housing shell unit is disposed on the magnet unit.

7. The magnetic resonance device as claimed in claim 1, wherein the housing unit comprises at least one material bonding unit by which the housing shell unit is disposed on the magnet unit.

8. The magnetic resonance device as claimed in claim 1, wherein the housing unit is magnetic resonance compatible.

\* \* \* \* \*